(12) United States Patent
Moriyama et al.

(10) Patent No.: US 9,470,861 B2
(45) Date of Patent: Oct. 18, 2016

(54) OPTICAL MODULE

(71) Applicant: FUJITSU COMPONENT LIMITED, Shinagawa-ku, Tokyo (JP)

(72) Inventors: Satoshi Moriyama, Tokyo (JP); Osamu Daikuhara, Tokyo (JP); Takuya Uchiyama, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 133 days.

(21) Appl. No.: 14/330,159

(22) Filed: Jul. 14, 2014

(65) Prior Publication Data

US 2015/0331208 A1 Nov. 19, 2015

(30) Foreign Application Priority Data

Jul. 18, 2013 (JP) .................................. 2013-149822

(51) Int. Cl.
*G02B 6/42* (2006.01)
*H01L 31/0232* (2014.01)
*H01S 5/022* (2006.01)
*G02B 6/44* (2006.01)
*G02B 6/38* (2006.01)

(52) U.S. Cl.
CPC ............. *G02B 6/4269* (2013.01); *G02B 6/428* (2013.01); *G02B 6/4257* (2013.01); *G02B 6/4295* (2013.01); *H01L 31/0232* (2013.01); *H01S 5/022* (2013.01); *G02B 6/3814* (2013.01); *G02B 6/3885* (2013.01); *G02B 6/4201* (2013.01); *G02B 6/4246* (2013.01); *G02B 6/4267* (2013.01); *G02B 6/4268* (2013.01); *G02B 6/4292* (2013.01); *G02B 6/4436* (2013.01)

(58) Field of Classification Search
CPC G02B 6/4246; G02B 6/3814; G02B 6/4201; G02B 6/4267; G02B 6/4268; G02B 6/4436
See application file for complete search history.

(56) References Cited

U.S. PATENT DOCUMENTS

| 6,749,345 | B1 * | 6/2004 | Gee | G02B 6/421 385/75 |
| 2005/0095901 | A1 * | 5/2005 | Miller | G02B 6/4201 439/485 |
| 2006/0045413 | A1 * | 3/2006 | Weigert | G02B 6/4201 385/15 |
| 2009/0190310 | A1 * | 7/2009 | Hosking | G02B 6/4292 361/699 |
| 2010/0061679 | A1 * | 3/2010 | Hayashi | G02B 6/138 385/14 |
| 2011/0243509 | A1 * | 10/2011 | Wang | G02B 6/4246 385/88 |

(Continued)

FOREIGN PATENT DOCUMENTS

JP 2012-68539 4/2012

*Primary Examiner* — Thomas A Hollweg
*Assistant Examiner* — Mary A El Shammaa
(74) *Attorney, Agent, or Firm* — Staas & Halsey LLP

(57) ABSTRACT

An optical module includes a housing including an upper cover and a lower cover, a first circuit board having a wiring pattern for transmitting an electric signal, a second circuit board on which a photonic device is bonded, the photonic device converting the electric signal into light or converting the light into the electric signal, an optical waveguide that is provided on the first circuit board, and guides the light output from the photonic device or the light to be incident on the photonic device, and a first thermal conducting member having plasticity, wherein the optical waveguide, the second circuit board, and the first thermal conducting member are layered on the first circuit board, a first protrusion formed on the upper cover is adhered to a top surface of the first thermal conducting member, and the first thermal conducting member is adhered to a top surface of the photonic device.

6 Claims, 6 Drawing Sheets

(56) References Cited

U.S. PATENT DOCUMENTS

| | | | |
|---|---|---|---|
| 2012/0327668 A1* | 12/2012 | Chan | G02B 6/4201 362/362 |
| 2013/0114629 A1* | 5/2013 | Firth | G02B 6/4201 372/20 |
| 2013/0146253 A1* | 6/2013 | Daly | H05K 7/20281 165/80.4 |

* cited by examiner

OPTICAL MODULE

CROSS-REFERENCE TO RELATED APPLICATION

This application is based upon and claims the benefit of priority of the prior Japanese Patent Application No. 2013-149822, filed on Jul. 18, 2013, the entire contents of which are incorporated herein by reference.

FIELD

The embodiments discussed herein are related to an optical module.

BACKGROUND

Recently, there have been increasing demands for high-speed signal transmissions in the field of supercomputers, high-end servers, and the like. Next-generation interfaces currently being developed, such as InfiniBand Trade Association's Enhanced Data Rate (IBTA EDR) and 100 Gigabit Ethernet (registered trademark), have an extended distance of signal transmissions, e.g., several-ten meters. Therefore, there has been increased use of optical communications capable of supporting high speed signal transmissions with an extended transmission distance.

In optical communications, optical modules are used to perform conversions between an electric signal and light. In the frontplane or the backplane of a high-end server, for example, an optical module is used in a connection between an optical cable and a server blade. The optical module converts the light received from the optical cable into an electric signal, and outputs the electric signal to the server blade. The optical module also converts an electric signal received from the server blade into light, and outputs the light to the optical cable.

In the housing of an optical module, a "photoelectric transducer" for performing conversions between an electric signal and light is provided. A photoelectric transducer is a flexible printed circuit (FPC) implemented with a photoemitter, a driver integrated circuit (IC) for driving the photoemitter, a photoreceiver, and a trans-impedance amplifier (TIA) for converting a current received from the photoreceiver into a voltage. A related-art example is disclosed in Japanese Laid-open Patent Publication No. 2012-068539.

The photoelectric transducer becomes highly heated as it operates. The driver IC and the TIA are the main sources of the heat. Hence, when the heat released from the photoelectric transducer stays in the housing of the optical module, the temperature rises inside of the housing, and such a temperature rise may cause malfunctioning of the photoemitter and the photoreceiver, or deformation of the FPC, for example, and result in failure of the optical module.

SUMMARY

According to an aspect of an embodiment, an optical module includes a housing including an upper cover and a lower cover, a first circuit board having a wiring pattern for transmitting an electric signal, a second circuit board on which a photonic device is bonded, the photonic device converting the electric signal into light or converting the light into the electric signal, an optical waveguide that is provided on the first circuit board, and guides the light output from the photonic device or the light to be incident on the photonic device, and a first thermal conducting member having plasticity, wherein, the optical waveguide, the second circuit board, and the first thermal conducting member are layered on the first circuit board, a first protrusion formed on the upper cover is adhered to a top surface of the first thermal conducting member, and the first thermal conducting member is adhered to a top surface of the photonic device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
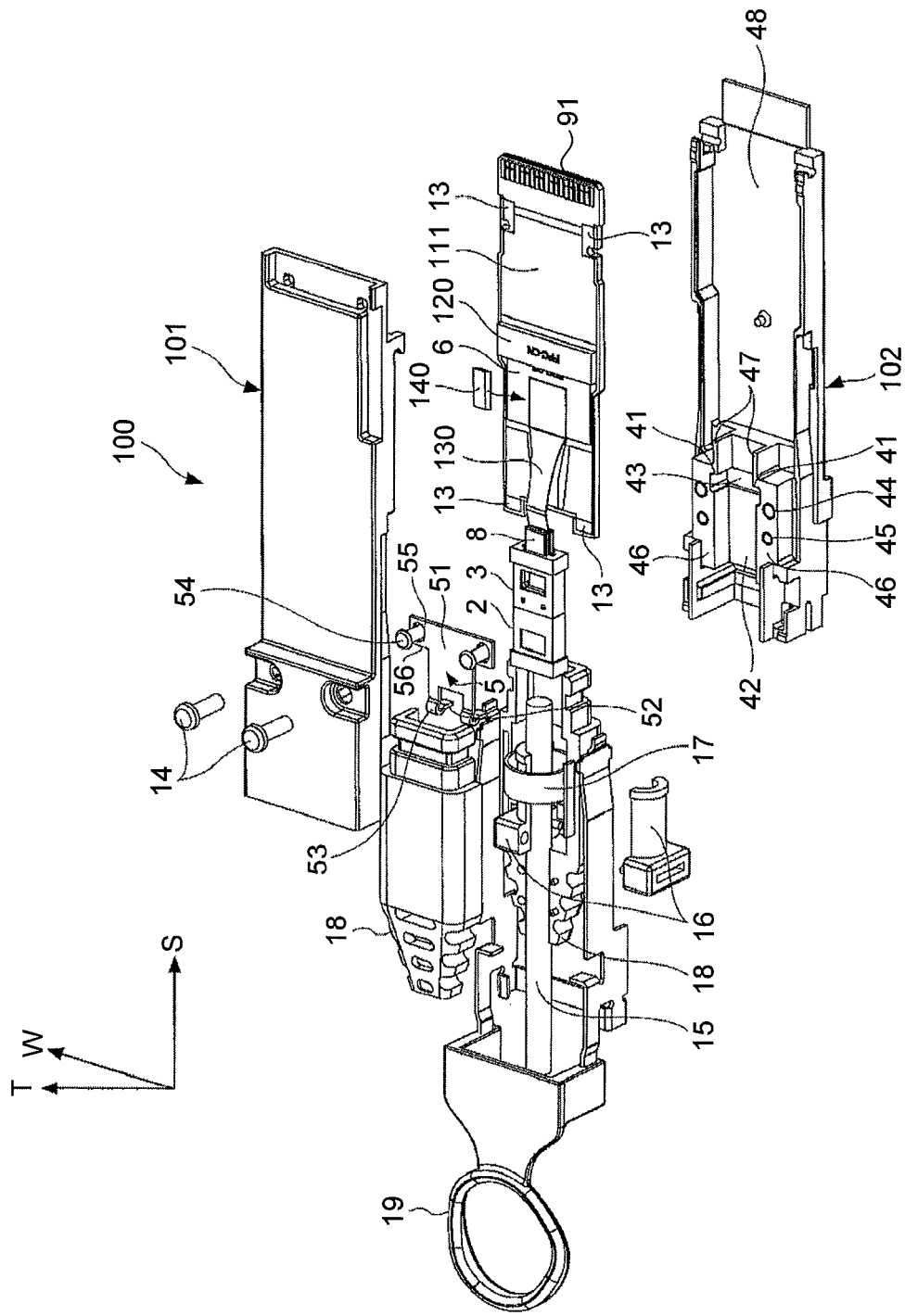
FIG. 1 is a schematic (exploded view) illustrating a structure of the optical module according to a first embodiment of the present invention.

Embodiments of the present invention will be explained with reference to accompanying drawings. The embodiments are not intended to limit the scope of the optical module according to the present invention in any way. The same elements described in the embodiments are assigned with the same reference numerals, and redundant explanations thereof are omitted herein.

[a] First Embodiment

Structure of Optical Module

FIG. 1 is a schematic (exploded view) illustrating a structure of the optical module according to a first embodiment of the present invention.

As illustrated in FIG. 1, the optical module 100 according to the first embodiment includes a mechanically transferable (MT) ferrule 2, and a lens ferrule 3 aligned with the MT ferrule 2 via alignment pins. The optical module 100 also includes a lower cover 102 having a support 41 for supporting the lens ferrule 3 from the side of a connecting direction S, and a ferrule clip 5 fastened to the lower cover 102 to press the MT ferrule 2 against the lens ferrule 3. The support 41 is a wall facing the opposite direction of the connecting direction S.

In FIG. 1, "S" represents the direction in which the MT ferrule 2 is connected to the lens ferrule 3, "T" represents a thickness direction of the plate-like lower cover 102 of the optical module 100 in a direction from the bottom toward the opening, and "W" represents a width direction that is perpendicular to the connecting direction S and the thickness direction T. In the first embodiment, for the illustrative purpose, the arrow representing the thickness direction T is illustrated to point upwardly, and the arrow representing the width direction W is illustrated to point to the left with respect to the connecting direction S. Only the connecting direction S, and not the thickness direction T and the width direction W, has directionality.

The MT ferrule 2 has an almost cuboid shape, and has an extended portion extended in the width direction W and the thickness direction T on the side opposite to the connecting direction S. The lens ferrule 3 also has an almost cuboid shape, and has an extended portion extended in the width direction W and the thickness direction T on the side of the connecting direction S. The support 41 on the lower cover 102 supports the right end surface of the extended portion in the lens ferrule 3.

The ferrule clip 5 includes a plate-like portion 51 fastened to the lower cover 102, a pair of abutting portions 52 abutting against the left end surface of the MT ferrule 2, a pair of springs 53 connecting the abutting portions 52 to the plate-like portion 51 and giving a biasing force to the abutting portions 52 toward the MT ferrule 2. An example of the material of the ferrule clip 5 includes a flexible metal. The ferrule clip 5 also includes screws 54 to be tightened to the lower cover 102, and threaded holes 55 in which the screws 54 are passed. The plate-like portion 51 has a pair of tabs 56 correspondingly to the threaded holes 55.

The lower cover 102 has a U-shaped cutout 42 in which the MT ferrule 2 and the lens ferrule 3 are fitted and aligned. On the side nearer to the support 41 than the cutout 42, an enclosure 43 that accommodates the extended portion of the lens ferrule 3 is provided. The enclosure 43 is wider in the width direction W and deeper in the thickness direction T than the cutout 42. The lower cover 102 also has a block portion 46 having a pair of female screws 44 corresponding to screws 14 on an upper cover 101, and a pair of female screws 45 corresponding to the screws 54 on the ferrule clip 5, at positions outside of the cutout 42 in the width direction W. The female screws 44 are positioned nearer to the support 41 than the female screws 45. A pair of enclosure walls 47 that accommodates a ferrule boot 8 therebetween is provided nearer to the connecting direction S than the support 41.

The optical module 100 includes an optical waveguide 130 extending from the lens ferrule 3 toward a photoelectric transducer 6, and a ferrule boot 8 for keeping the optical waveguide 130 bent. Because the ferrule boot 8 is positioned at a shorter distance to the photoelectric transducer 6 than the length of the optical waveguide 130, the optical waveguide 130 is kept bent.

The optical module 100 also includes a printed board 111, and an electrical connector 120 implemented at a predetermined position on the printed board 111, and the photoelectric transducer 6 is connected to the electrical connector 120 on the printed board 111. A card edge connector 91 is implemented on the right edge of the printed board 111.

The optical module 100 includes the upper cover 101 for covering the opening of the lower cover 102, and a thermal conducting sheet 140 for conducting the heat produced by the photoelectric transducer 6 to the upper cover 101 to release the heat.

On the printed board 111, the area covering from where the electrical connector 120 is implemented to where the card edge connector 91 is placed is wider than the area where the photoelectric transducer 6 is implemented in the width direction W. The printed board 111 is housed in a board enclosure 48 positioned nearer to the connecting direction S than the enclosure walls 47 of the lower cover 102.

An optical fiber 15 extends from the MT ferrule 2, on the side opposite to the connecting direction S. The optical fiber 15 is passed through a pair of sleeves 16 and a fastening ring 17, and fitted in a pair of cable boots 18. A pull-tab/latch 19 is attached to the cable boot 18.

To fill the gap between the printed board 111 and the upper cover 101, synthetic resin members 13 are positioned at predetermined positions on the printed board 111.

Figure 2A:
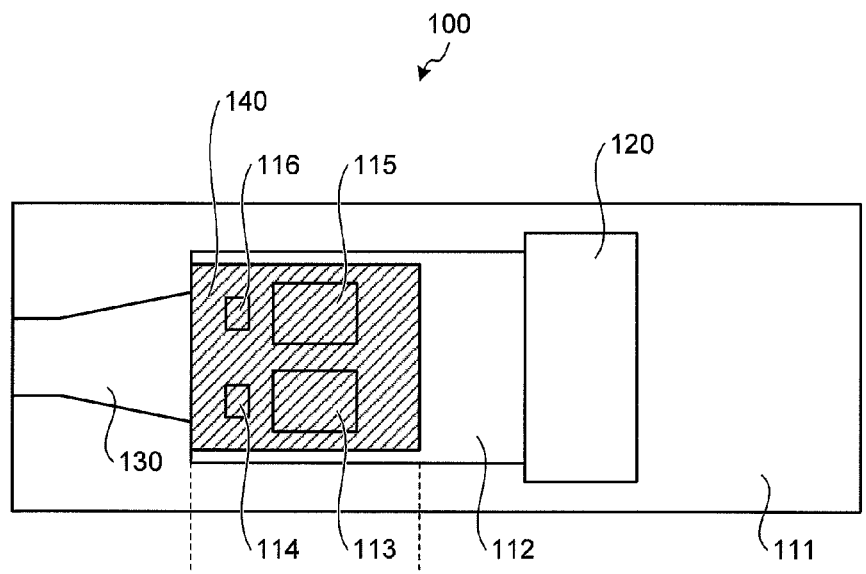
FIG. 2A is a schematic of an internal structure of the optical module according to the first embodiment.
Figure 2B:
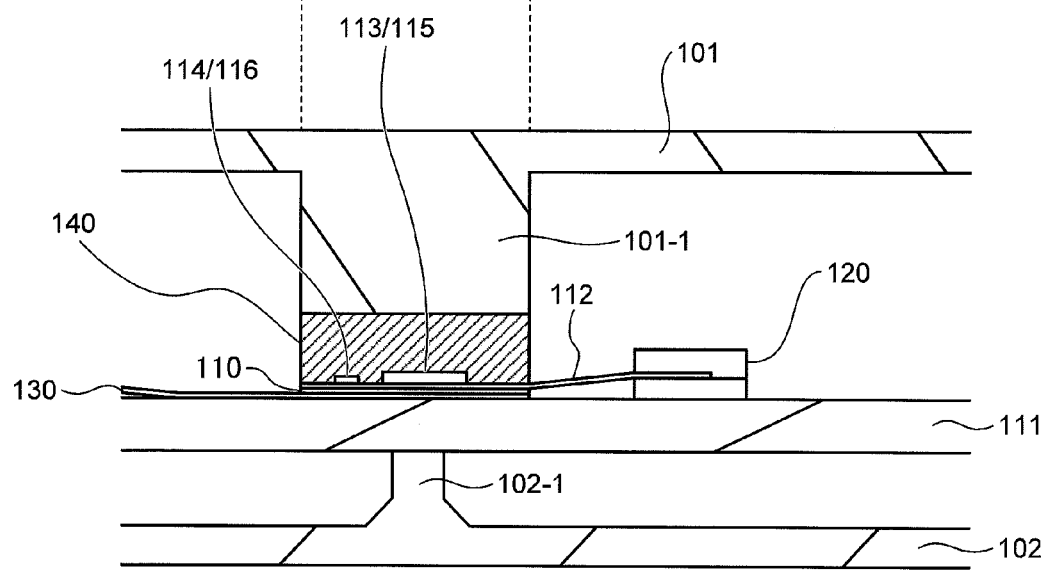
FIG. 2B is a schematic of an internal structure of the optical module according to the first embodiment.

FIGS. 2A and 2B are schematics of an internal structure of the optical module according to the first embodiment. FIG. 2A is a plan view, and FIG. 2B is a cross-sectional view along a direction of the optical transmission.

In FIGS. 2A and 2B, the optical module 100 includes the upper cover 101, the lower cover 102, the printed board 111, the electrical connector 120, an FPC 112, a lens sheet 110, the optical waveguide 130, and the thermal conducting sheet 140. Examples of the material for the upper cover 101 and the lower cover 102 includes machined aluminum and di-casted zinc. The upper cover 101 and the lower cover 102 together form the housing of the optical module as a pair. The optical module 100 also includes a driver IC 113, a photoemitter 114, a TIA 115, and a photoreceiver 116 all of which is implemented on the FPC 112.

The card edge connector 91 is provided on the right edge of the printed board 111, and the optical module 100 is connected to a server blade via the card edge connector 91. At least on the top surface of the printed board 111, wiring patterns are provided between the card edge connector 91 and the electrical connector 120, and electric signals are transmitted via the wire patterns.

At least on the top surface of the FPC 112, wiring patterns are provided, and the FPC 112 is electrically connected to the wiring patterns on the printed board 111 via the electrical connector 120. As the material for the FPC 112, a thin, transparent material causing less attenuation of electric signals in a high frequency range (e.g., polyimide) is used.

On the top surface of the FPC 112, the photoemitter 114 and the photoreceiver 116 that are photonic devices are face-down bonded. The photoemitter 114 converts an electric signal input via the electrical connector 120 into light. The photoreceiver 116 converts light incident from the optical waveguide 130 to an electric signal. On the top surface of the FPC 112, the driver IC 113 for driving the photoemitter 114 is provided near the photoemitter 114, and the TIA 115 for converting a current from the photoreceiver 116 into a voltage is provided near the photoreceiver 116. The face-down bonding of the photoemitter 114 and the photoreceiver 116 can be achieved using a general electric device bonding method, such as a flip-chip bonder. The photoemitter 114 is a vertical cavity semiconductor emission laser (VCSEL) array, for example, and the photoreceiver 116 is a photodiode (PD) array, for example. The photoemitter 114, the photoreceiver 116, the driver IC 113, and the TIA 115 are implemented on the FPC 112 to provide the photoelectric transducer 6 that converts electricity to light, and light to electricity.

On the bottom surface of the FPC 112, the lens sheet 110 is bonded with an adhesion layer interposed therebetween.

The lens sheet 110 is made of a transparent material and partly provided with a collection lens.

The optical waveguide 130 for transmitting light is bonded to the bottom surface of the lens sheet 110. The optical waveguide 130 guides the light output from the photoemitter 114, and light incident on the photoreceiver 116. The optical waveguide 130 is a sheet-like optical waveguide, and is a polymer optical waveguide, for example. The optical waveguide 130 is provided with a mirror (not illustrated) for bending the light path by 90 degrees and coupling the light.

The thermal conducting sheet 140 is a thermal conducting member having plasticity. An example of the material for the thermal conducting sheet 140 includes a synthetic resin containing thermally conductive filler. The thermal conducting sheet 140 is layered on the FPC 112 in such a manner that the bottom surface of the thermal conducting sheet 140 entirely covers the top surfaces of the driver IC 113, the photoemitter 114, the TIA 115, and the photoreceiver 116. When a protrusion 101-1 extending downwardly from the upper cover 101 is pressed down against the thermal conducting sheet 140 disposed in this manner, the thermal conducting sheet 140 becomes deformed, and the bottom surface of the thermal conducting sheet 140 closely adheres at least to the top surfaces of the driver IC 113, the photoemitter 114, the TIA 115, and the photoreceiver 116.

In order to ensure the adhesion of the thermal conducting sheet 140, the position of the protrusion 101-1 in the plan view is preferably matched with the positions of the driver IC 113, the photoemitter 114, the TIA 115, and the photoreceiver 116. Furthermore, in order to ensure the adhesion of the thermal conducting sheet 140, the surface area of the bottom surface of the protrusion 101-1 is preferably equal to or larger than the surface area surrounded by the outer circumference of the driver IC 113, the photoemitter 114, the TIA 115, and the photoreceiver 116. For example, it is suitable to provide the bottom surface of the protrusion 101-1 with a surface area equal to or slightly larger than the surface area of the thermal conducting sheet 140 entirely covering the top surfaces of the driver IC 113, the photoemitter 114, the TIA 115, and the photoreceiver 116. In order to ensure adhesion of the thermal conducting sheet 140, the thickness of the thermal conducting sheet 140 before deformation is preferably larger than the distance between the bottom surface of the protrusion 101-1 and the top surface of the printed board 111. For example, when the distance between the bottom surface of the protrusion 101-1 and the top surface of the printed board 111 is 1.4 millimeters, it is suitable for the thickness of the thermal conducting sheet 140 before deformation to be 2.0 millimeters, for example.

By placing the thermal conducting sheet 140 having plasticity over the photoelectric transducer 6, and causing the protrusion 101-1 to press down the thermal conducting sheet 140, the bottom surface of the thermal conducting sheet 140 closely adheres at least to the top surfaces of the driver IC 113, the photoemitter 114, the TIA 115, and the photoreceiver 116, and the top surface of the thermal conducting sheet 140 closely adheres to the bottom surface of the protrusion 101-1. Therefore, the heat produced in the photoelectric transducer 6 is communicated to the upper cover 101 via the thermal conducting sheet 140, and released into the air outside of the optical module 100 via the outer surface of the upper cover 101. Therefore, the heat produced by the photoelectric transducer 6 can be efficiently released to the outside of the housing of the optical module 100. In other words, according to the embodiment, an optical module 100 with a high heat dissipation efficiency can be provided.

Furthermore, by using a member having plasticity as the thermal conducting sheet 140, such deformation of the thermal conducting sheet 140 can absorb the dimensional allowance in the distance between the upper cover 101 and the printed board 111.

When the thermal conducting sheet 140 is pressed down by the protrusion 101-1, because part of the pressure of the protrusion 101-1 applied to the thermal conducting sheet 140 is communicated to the printed board 111, the printed board 111 may become warped. To address this issue, the lower cover 102 is provided with a protrusion 102-1 protruding upwardly. By allowing the top surface of the protrusion 102-1 to come into contact with the bottom surface of the printed board 111, the printed board 111 is supported from the bottom by the protrusion 102-1. The position of the protrusion 102-1 on the printed board 111 in the plan view is preferably matched with the position of the protrusion 101-1 in the plan view. In other words, the protrusion 102-1 is preferably provided at a position facing the protrusion 101-1 on the lower cover 102. As the top surface area of the protrusion 102-1, an area smaller than the bottom surface area of the protrusion 101-1 suffices to support the printed board 111.

In the manner described above, by providing the lower cover 102 with the protrusion 102-1 supporting the printed board 111 from the bottom at a position facing the protrusion 101-1 pressing down the thermal conducting sheet 140, warping of the printed board 111 can be prevented when the thermal conducting sheet 140 is pressed down.

[b] Second Embodiment

Internal Structure of Optical Module

The thermal resistivity of the thermal conducting sheet 140 explained in the first embodiment is higher than that of the upper cover 101. Moreover, when the thermal conducting sheet 140 is thicker, the thermal resistivity becomes higher. Therefore, in order to improve the heat dissipation efficiency to the upper cover 101, it is preferable to make the thermal conducting sheet 140 thin as much as possible. Therefore, in a second embodiment of the present invention, the thickness of the thermal conducting sheet placed between the protrusion 101-1 and the photoelectric transducer 6 is reduced in the manner described below.

Figure 3:
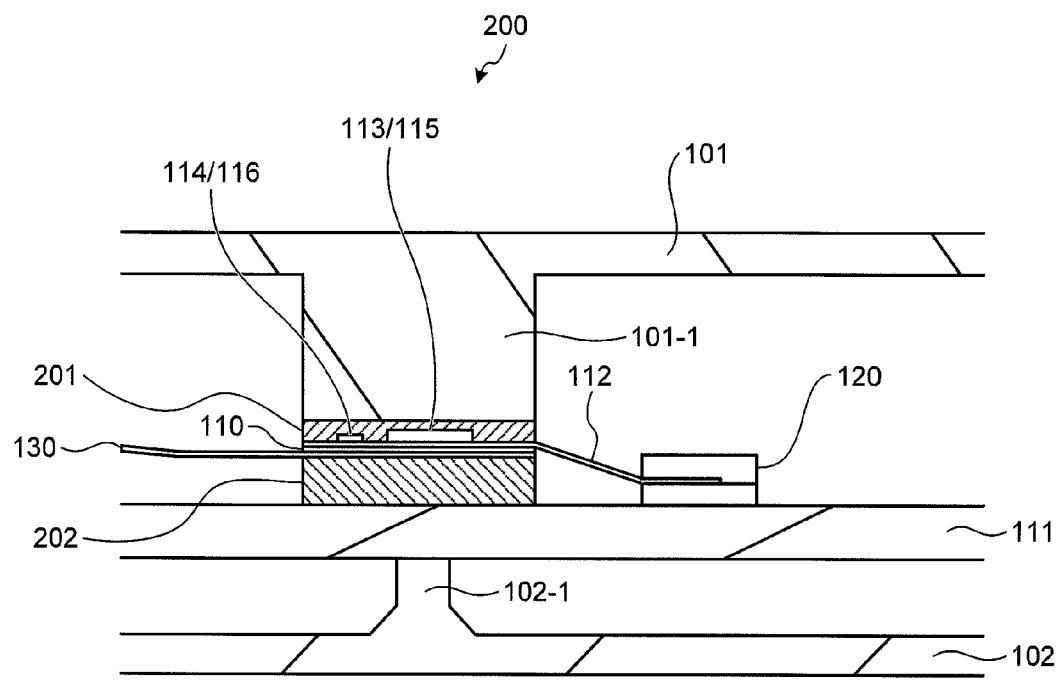
FIG. 3 is a schematic (cross-sectional view) for illustrating an internal structure of an optical module according to a second embodiment of the present invention.

FIG. 3 is a schematic (cross-sectional view) for illustrating an internal structure of an optical module according to the second embodiment. Because the top view is the same as that of the optical module according to the first embodiment, the drawing is omitted herein.

In FIG. 3, this optical module 200 includes a thermal conducting sheet 201 and another thermal conducting sheet 202. The thermal conducting sheets 201 and 202 are thermal conducting members having plasticity. An example of the material for the thermal conducting sheets 201 and 202 includes a synthetic resin containing thermally conductive filler. The thermal conducting sheet 201 corresponds to, but is thinner than the thermal conducting sheet 140 according to the first embodiment.

The thermal conducting sheet 201 is layered on the FPC 112, in the same manner as in the first embodiment. The thermal conducting sheet 202 is layered between the bottom surface of the optical waveguide 130 and the top surface of the printed board 111. The thermal conducting sheet 202 has the same area as the thermal conducting sheet 201. When the protrusion 101-1 is pressed down against the thermal conducting sheet 201 disposed in this manner, the thermal conducting sheet 201 become deformed, in the same manner as in the first embodiment, and the bottom surface of the thermal conducting sheet 201 closely adheres at least to the top surfaces of the driver IC 113, the photoemitter 114, the TIA 115, and the photoreceiver 116. At the same time, the thermal conducting sheet 202 is deformed by receiving pressure from the protrusion below 102-1 via the printed board 111, and the top surface of the thermal conducting sheet 202 closely adheres to the bottom surface of the optical waveguide 130, and the bottom surface of the thermal conducting sheet 202 closely adheres to the top surface of the printed board 111. In other words, the thermal conducting sheet 202 having plasticity is used to fill the gap formed between the bottom surface of the optical waveguide 130 and the top surface of the printed board 111 when the thickness of the thermal conducting sheet 201 is reduced from that of the thermal conducting sheet 140 according to the first embodiment.

When the distance between the bottom surface of the protrusion 101-1 and the top surface of the printed board 111 is 1.4 millimeters, for example, the thickness of the thermal conducting sheet 201 before deformation may be suitably set to 0.5 millimeter, for example, and the thickness of the thermal conducting sheet 202 before deformation may be suitably set to 1.0 millimeter, for example.

In the manner described above, according to the second embodiment, the heat dissipation efficiency to the upper cover 101 can be improved because the thickness of the thermal conducting sheet positioned between the protrusion 101-1 and the photoelectric transducer 6 is reduced.

Furthermore, in the second embodiment, the thermal conducting sheet 202 having plasticity is used to fill the gap formed between the bottom surface of the optical waveguide 130 and the top surface of the printed board 111 when the thickness of the thermal conducting sheet 201 is reduced. In this manner, the thermal conducting sheet 201 is allowed to adhere to the driver IC 113, the photoemitter 114, the TIA 115, and the photoreceiver 116 more closely. Furthermore, a part of dimensional allowance not absorbed by the thin thermal conducting sheet 201 in the distance between the upper cover 101 and the printed board 111 can be absorbed by deformation of the thermal conducting sheet 202.

Furthermore, in the second embodiment, the same member of the thermal conducting sheet 202 is used for the thermal conducting sheet 201 as well. In this manner, an increase in the production cost of the optical module 200 for improving the heat dissipation efficiency can be suppressed.

[c] Third Embodiment
Internal Structure of Optical Module

Figure 4:
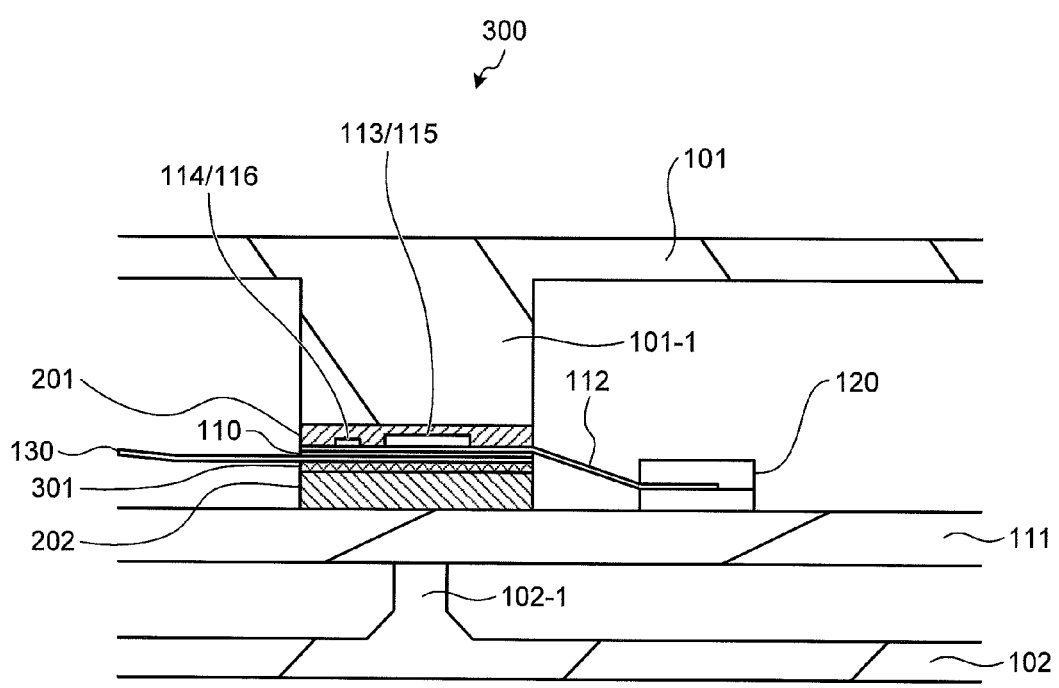
FIG. 4 is a schematic (cross-sectional view) for illustrating an internal structure of an optical module according to a third embodiment of the present invention.

FIG. 4 is a schematic (cross-sectional view) for illustrating an internal structure of an optical module according to a third embodiment of the present invention. Because the top view is the same as that of the optical module according to the first embodiment, the drawing is omitted herein.

In this optical module 300 illustrated in FIG. 4, a metal plate 301 is layered between the bottom surface of the optical waveguide 130 and the top surface of the thermal conducting sheet 202.

While the FPC 112 and the optical waveguide 130 are tend to warp easily upon receiving the application of the pressing force from the protrusion 101-1, the metal plate 301 does not warp. Therefore, by providing the metal plate 301 below the FPC 112 and the optical waveguide 130, the pressing force applied by the protrusion 101-1 can be evenly distributed across the top surface of the thermal conducting sheet 202, so that inclination of the top surface of the thermal conducting sheet 202 can be prevented. Hence, when the thermal conducting sheet 202 is used to fill the gap between the bottom surface of the optical waveguide 130 and the top surface of the printed board 111, the thermal conducting sheet 201 is allowed to adhere to the driver IC 113, the photoemitter 114, the TIA 115, and the photoreceiver 116 more closely.

[d] Fourth Embodiment
Internal Structure of Optical Module

Figure 5:
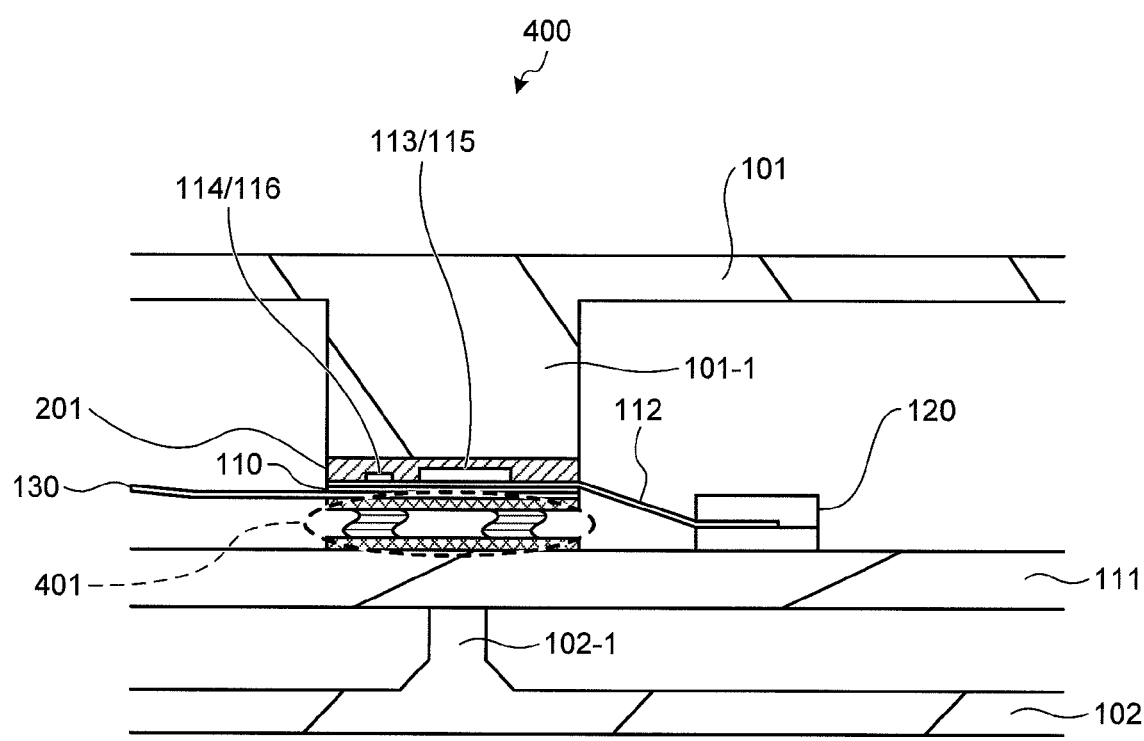
FIG. 5 is a schematic (cross-sectional view) for illustrating an internal structure of an optical module according to a fourth embodiment of the present invention.

FIG. 5 is a schematic (cross-sectional view) for illustrating an internal structure of an optical module according to a fourth embodiment of the present invention. Because the top view is the same as that of the optical module according to the first embodiment, the drawing is omitted herein.

In this optical module 400 illustrated in FIG. 5, an elastic body 401 is layered between the bottom surface of the optical waveguide 130 and the top surface of the printed board 111, instead of the thermal conducting sheet 202 according to the second embodiment. Examples of the elastic body 401 include a disk spring and rubber.

In the fourth embodiment, the elastic body 401 is used to fill the gap formed between the bottom surface of the optical waveguide 130 and the top surface of the printed board 111 when the thickness of the thermal conducting sheet 201 is reduced. In this manner, the thermal conducting sheet 201 is allowed to adhere to the driver IC 113, the photoemitter 114, the TIA 115, and the photoreceiver 116 more closely. Furthermore, a part of dimensional allowance not absorbed by the thin thermal conducting sheet 201 in the distance between the upper cover 101 and the printed board 111 can be absorbed by deformation of the elastic body 401.

[e] Fifth Embodiment
Internal Structure of Optical Module

Characteristics of the photoemitter 114 and the photoreceiver 116 change depending on the temperature. Hence, the photoemitter 114 and the photoreceiver 116 are generally controlled based on the temperature. In the photoelectric transducer 6, the driver IC 113 and the TIA 115 are main sources of heat, and the heat released from the driver IC 113 and the TIA 115 brings up the temperatures of the photoemitter 114 and the photoreceiver 116. Because the photoemitter 114 and the photoreceiver 116 are not provided with temperature sensors, the temperature measured by a temperature sensor in the driver IC 113 or the TIA 115, that is the temperature of the driver IC 113 or the TIA 115, has been used conventionally as the temperatures of the photoemitter 114 and the photoreceiver 116.

A possible alternative is to provide temperature sensors at positions nearer to the photoemitter 114 and the photoreceiver 116 and to directly measure the temperatures of the photoemitter 114 and the photoreceiver 116, instead of providing the temperature sensors in the driver IC 113 or the TIA 115. However, because such temperature sensors are positioned at some distance from the photoemitter 114 and the photoreceiver 116, when the distance is larger, the temperatures measured by the temperature sensors deviate more from the actual temperatures of the photoemitter 114 and the photoreceiver 116. In other words, temperature measurement error increases.

To address this issue, in the fifth embodiment, the temperatures of the photoemitter 114 and the photoreceiver 116 are measured in the manner described below.

Figure 6A:
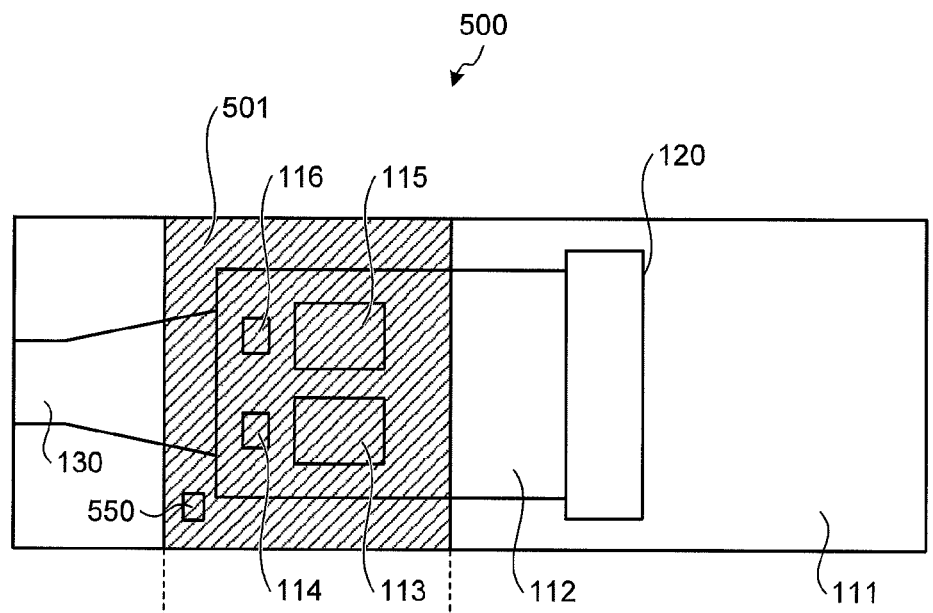
FIG. 6A is a schematic of an internal structure of an optical module according to a fifth embodiment of the present invention.
Figure 6B:
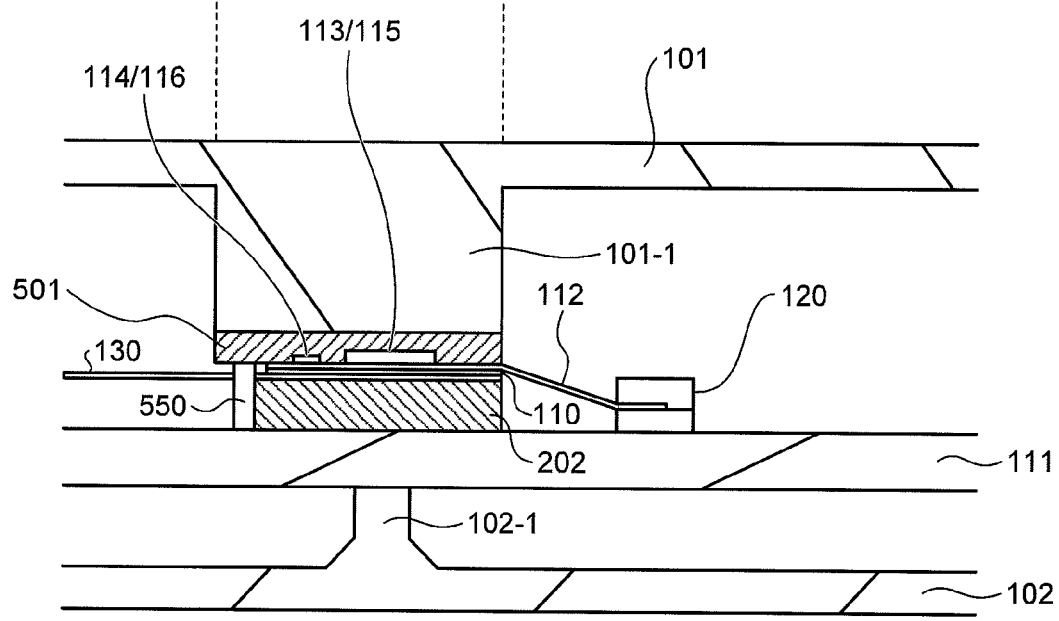
FIG. 6B is a schematic of an internal structure of an optical module according to a fifth embodiment of the present invention.

FIGS. 6A and 6B are schematics of an internal structure of an optical module according to the fifth embodiment. FIG. 6A is a top view, and FIG. 6B is a cross-sectional view along the direction of the optical transmission.

In FIGS. 6A and 6B, this optical module 500 includes a thermal conducting sheet 501 and temperature sensor 550.

The thermal conducting sheet 501 is a thermal conducting member having plasticity, and is layered on the FPC 112 in such a manner that the bottom surface of the thermal conducting sheet 501 entirely covers the top surfaces of the driver IC 113, the photoemitter 114, the TIA 115, the photoreceiver 116, and the temperature sensor 550. When the protrusion 101-1 is pressed down against the thermal conducting sheet 501 disposed in this manner, the thermal conducting sheet 501 become deformed, and the bottom surface of the thermal conducting sheet 501 closely adheres at least to the top surfaces of the driver IC 113, the photoemitter 114, the TIA 115, and the photoreceiver 116. The bottom surface of the thermal conducting sheet 501 also closely adheres to the top surface of the temperature sensor 550.

The temperature sensor 550 is provided at a predetermined position on the printed board 111. The temperature sensor 550 is particularly preferable to be positioned near the periphery of the FPC 112.

Explained in the example above is an example in which the bottom surface of the thermal conducting sheet 501 closely adheres to the top surface of the temperature sensor 550, but any surface of the thermal conducting sheet 501 may closely adhere to any surface of the temperature sensor 550 without limitation.

In this manner, according to the fifth embodiment, because the thermal conducting sheet 501 is positioned in close adhesion to the temperature sensor 550, the photoemitter 114, and the photoreceiver 116, the temperatures of the photoemitter 114 and the photoreceiver 116 are thermally conducted to the temperature sensor 550 via the thermal conducting sheet 501, not via the air. Therefore, the temperature sensor 550 can measure the temperatures of the photoemitter 114 and the photoreceiver 116 correctly.

Simulation of Thermal Conduction

Figure 7:
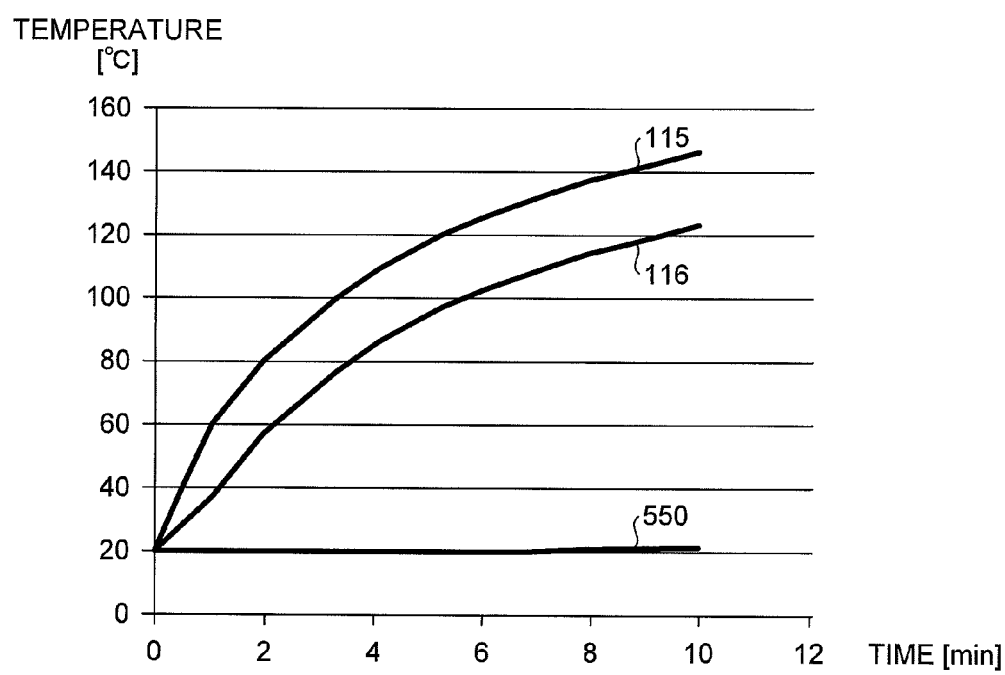
FIG. 7 is a graph indicating a simulation result of thermal conduction without a thermal conducting sheet.
Figure 8:
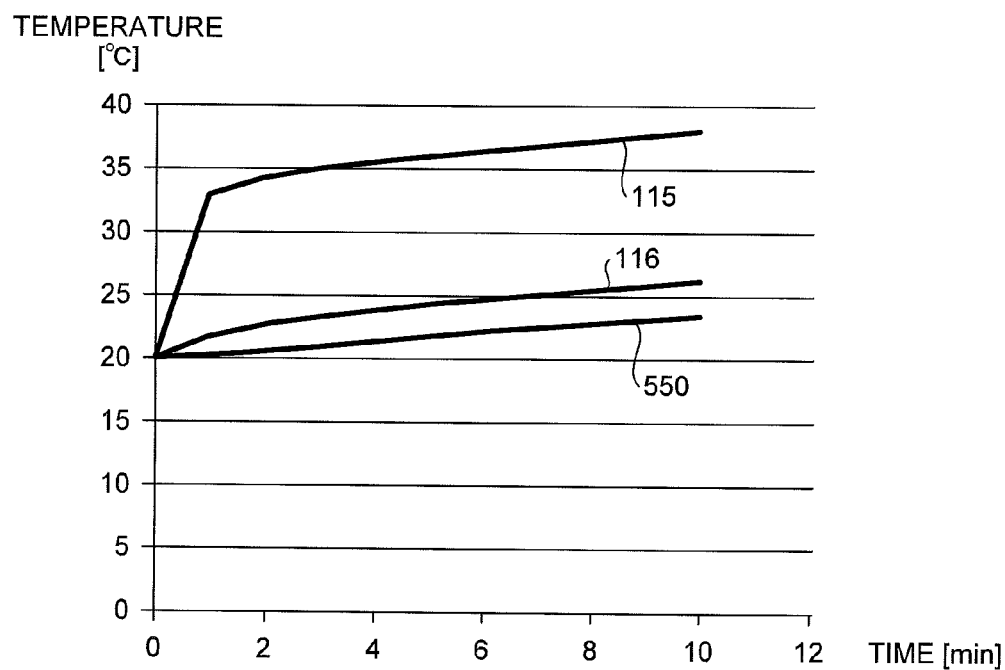
FIG. 8 is a graph indicating a simulation result of thermal conduction with the thermal conducting sheet.

FIG. 7 is a graph indicating a simulation result of thermal conduction without the thermal conducting sheet, and FIG. 8 is a graph indicating a simulation result of thermal conduction with the thermal conducting sheet. The amounts of heat generated in the TIA 115 and the photoreceiver 116 are both 0.8 watt in FIGS. 7 and 8.

As illustrated in FIG. 7, when the optical module 500 was not provided with the thermal conducting sheet 501, the TIA 115 and the photoreceiver 116 became highly heated, and the difference between the temperature of the photoreceiver 116 and the temperature measured at the temperature sensor 550 reached approximately 100 degrees Celsius, which is quite large.

By contrast, when the optical module 500 was provided with the thermal conducting sheet 501, the temperatures of the TIA 115 and the photoreceiver 116 became lower than those in FIG. 7 by approximately 100 degrees Celsius, as illustrated in FIG. 8. While the difference between the temperatures of the TIA 115 and the photoreceiver 116 was about 10 degrees Celsius, the difference between the temperature of the photoreceiver 116 and the temperature measured at the temperature sensor 550 was less than 3 degrees Celsius, which is quite small. It means that, by positioning the thermal conducting sheet 501 in a close adhesion to the temperature sensor 550 and the photoreceiver 116, the temperature sensor 550 becomes capable of measuring a correct temperature of the photoreceiver 116. Hence, correct control can be performed based on the temperatures.

The temperature sensor may be provided to any one of the structures according to the first to the fourth embodiments in which the thermal conducting sheet is provided in close adhesion to the temperature sensor.

According to one aspect of the present invention, it is possible to provide an optical module capable of dissipating heat highly efficiently.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
a housing including an upper cover and a lower cover;
a first circuit board having a wiring pattern for transmitting an electric signal;
a second circuit board on which a photonic device is bonded, the photonic device converting the electric signal into light or converting the light into the electric signal;
an optical waveguide that is provided on the first circuit board, and guides the light output from the photonic device or the light to be incident on the photonic device; and
a first thermal conducting member having plasticity, wherein,
the optical waveguide, the second circuit board, and the first thermal conducting member are layered on the first circuit board,
a first protrusion formed on the upper cover is adhered closely to a top surface of the first thermal conducting member, and
the first thermal conducting member is adhered closely to a top surface of the photonic device.

2. The optical module according to claim 1, wherein
the lower cover includes a second protrusion formed at a position facing the first protrusion, and
the second protrusion supports the first circuit board.

3. The optical module according to claim 1, further comprising a second thermal conducting member having plasticity, the second thermal conducting member being layered between the first circuit board and the optical waveguide, wherein
the first thermal conducting member is thinner than the second thermal conducting member.

4. The optical module according to claim 3, further comprising a metal plate layered between the second thermal conducting member and the optical waveguide.

5. The optical module according to claim 1, further comprising an elastic body layered between the first circuit board and the optical waveguide.

6. The optical module according to claim 1, further comprising a temperature sensor positioned on the first circuit board, wherein
the temperature sensor closely adheres to the first thermal conducting member.

* * * * *